(12) United States Patent
Rotay et al.

(10) Patent No.: US 9,643,502 B2
(45) Date of Patent: May 9, 2017

(54) METHOD AND APPARATUS TO MONITOR AN ON-VEHICLE BATTERY CHARGER

(71) Applicant: GM GLOBAL TECHNOLOGY OPERATIONS LLC, Detroit, MI (US)

(72) Inventors: Robert Rotay, Hartland, MI (US);
Robert B. Cooley, Ann Arbor, MI (US); Keith Kumar, Bailieboro (CA);
William M. Hare, Novi, MI (US);
Michael W. Adrian, Dimondale, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 217 days.

(21) Appl. No.: 14/686,874

(22) Filed: Apr. 15, 2015

(65) Prior Publication Data
US 2016/0303983 A1 Oct. 20, 2016

(51) Int. Cl.
*H02J 7/00* (2006.01)
*B60L 11/18* (2006.01)
*G01R 31/40* (2014.01)

(52) U.S. Cl.
CPC .......... *B60L 11/1809* (2013.01); *G01R 31/40* (2013.01); *H02J 7/00* (2013.01); *H02J 7/0021* (2013.01); *H02J 7/0031* (2013.01); *H02J 7/0077* (2013.01)

(58) Field of Classification Search
CPC .......... H02J 7/00; H02J 7/0021; H02J 7/0031; H02J 7/0077; G01R 31/40; B60L 11/1809
USPC .................................................. 320/109
See application file for complete search history.

(56) References Cited

U.S. PATENT DOCUMENTS

| 2008/0275600 | A1* | 11/2008 | Rask ................ B60K 6/24 701/22 |
| 2010/0156355 | A1* | 6/2010 | Bauerle ............ B60L 3/003 320/145 |
| 2012/0025842 | A1 | 2/2012 | Gibbs et al. | |
| 2015/0015201 | A1* | 1/2015 | Kim ............... B60L 11/1816 320/109 |

* cited by examiner

*Primary Examiner* — Nathaniel Pelton
(74) *Attorney, Agent, or Firm* — Quinn IP Law

(57) ABSTRACT

A method for monitoring an on-vehicle battery charger includes estimating a charging efficiency of the battery charger. Upon achieving an indeterminate result related to the estimated charging efficiency of the battery charger, a commanded input power to the battery charger and an electric power at the on-vehicle battery during operation of the battery charger are determined. Flow of electric current through the battery charger is interrupted, and electric power flow from the on-vehicle battery is determined. An active charging efficiency of the battery charger is determined based upon the commanded input power to the battery charger, the electric power at the on-vehicle battery during operation of the battery charger and the monitored electric power flow from the on-vehicle battery when the flow of electric current through the battery charger is interrupted. Charging performance of the battery charger is evaluated based upon the active charging efficiency.

14 Claims, 3 Drawing Sheets

METHOD AND APPARATUS TO MONITOR AN ON-VEHICLE BATTERY CHARGER

TECHNICAL FIELD

The present disclosure generally relates to plug-in electric vehicles and, more particularly, to methods for monitoring on-vehicle battery chargers employed to charge batteries of plug-in electric vehicles.

BACKGROUND

Electric vehicles (EVs) such as battery EVs (BEVs), plug-in hybrid EVs (PHEVs), and other vehicles electrically connect to remote electric power sources that supply AC electric power to charge on-vehicle batteries. Such vehicles employ an on-board charging system to convert AC electric power to DC electric power that is stored in the on-vehicle battery. The stored DC energy may be employed to supply electric power for propulsion and for on-vehicle electrical systems.

SUMMARY

An on-vehicle battery charger that electrically couples an off-vehicle electrical power source to an on-vehicle battery is described. A method for monitoring the on-vehicle battery charger includes executing a passive charger monitoring routine to estimate a charging efficiency of the battery charger. Upon achieving an indeterminate result related to the estimated charging efficiency of the battery charger, a commanded input power to the battery charger and an electric power at the on-vehicle battery during operation of the battery charger are determined. Flow of electric current through the battery charger is interrupted, and electric power flow from the on-vehicle battery is determined. An active charging efficiency of the battery charger is determined based upon the commanded input power to the battery charger, the electric power at the on-vehicle battery during operation of the battery charger and the monitored electric power flow from the on-vehicle battery when the flow of electric current through the battery charger is interrupted. Charging performance of the battery charger is evaluated based upon the active charging efficiency.

The above features and advantages, and other features and advantages, of the present teachings are readily apparent from the following detailed description of some of the best modes and other embodiments for carrying out the present teachings, as defined in the appended claims, when taken in connection with the accompanying drawings.

BRIEF DESCRIPTION OF THE DRAWINGS

One or more embodiments will now be described, by way of example, with reference to the accompanying drawings, in which.

DETAILED DESCRIPTION

Figure 1:
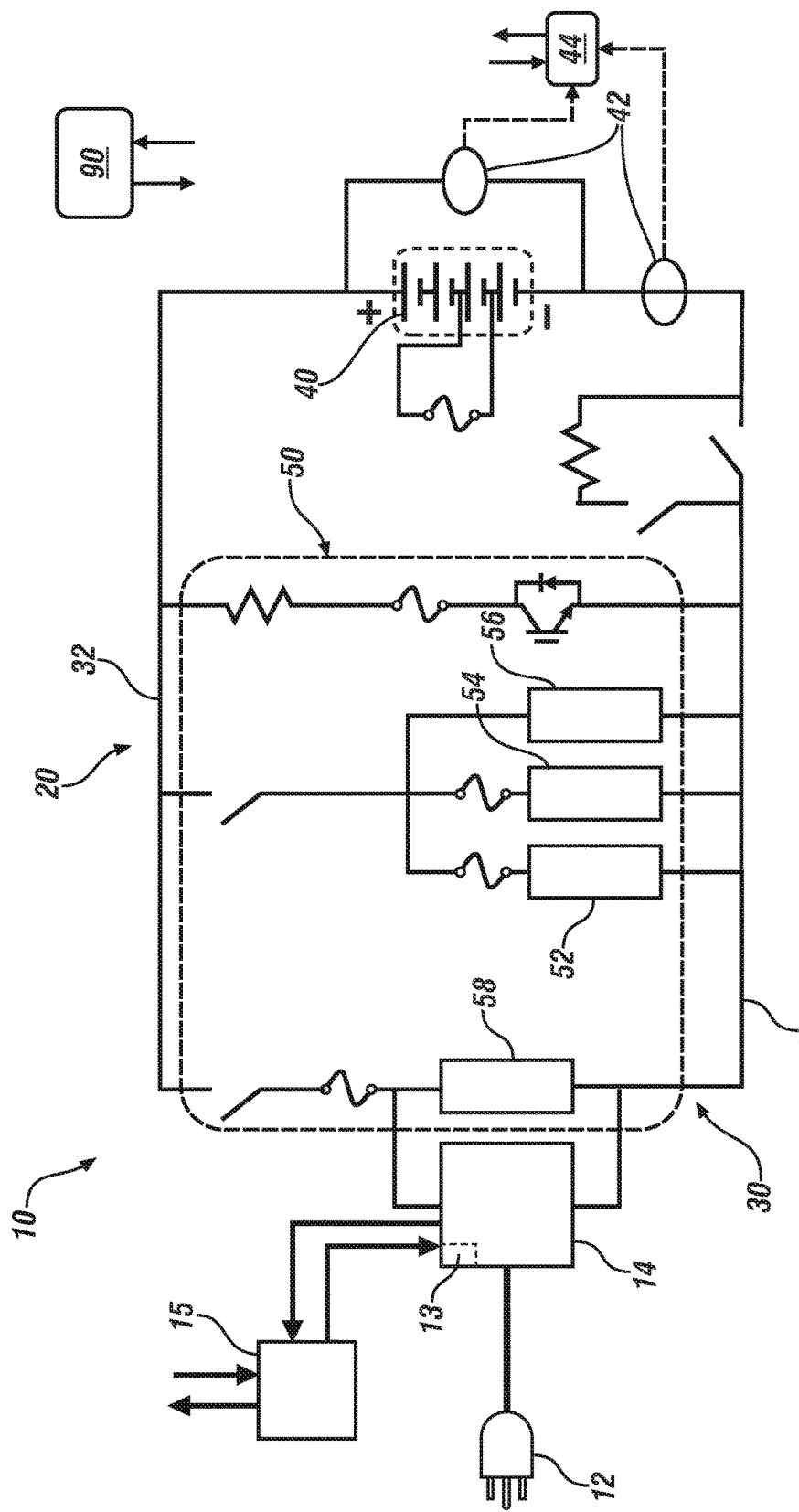
FIG. 1 schematically illustrates an electrical architecture for an electric vehicle (EV) including an external charger that electrically connects to a high-voltage electrical energy storage device (battery) to supply electric power to one or a plurality of high-voltage on-vehicle loads, in accordance with the disclosure.

Referring to the drawings, wherein like numerals indicate like or corresponding parts throughout the several views, FIG. 1 schematically illustrates an electrical architecture for a plug-in electric vehicle (P-EV) 10 including an on-vehicle battery charger 14 that electrically connects via a high-voltage bus 30 to an on-vehicle high-voltage electrical circuit 20. The on-vehicle high-voltage electrical circuit 20 includes a high-voltage electrical energy storage device (battery) 40 that supplies electric power to one or a plurality of high-voltage on-vehicle loads 50. A charger controller 15 provides monitoring and control functions to control operation of the battery charger 14. An on-vehicle controller 90 provides other monitoring and control functions, some of which are described herein. The P-EV 10 may be any suitable motorized vehicle that receives electric power from an off-vehicle power source for storage in the battery 40, including, by way of example, a battery EV, an extended-range EV or a plug-in hybrid EV. Electric power may be supplied through the battery charger 14 to the on-vehicle high-voltage electrical circuit 20 of the EV 10 when an ignition switch is in a key-off state, or under other operating conditions when the vehicle is stationary. This may include any operating condition when the vehicle is stationary and an on-vehicle internal combustion engine configured to electrically charge the battery 40 is in an OFF state.

The battery charger 14 is a device that increases electrical energy potential of an electrochemical cell, e.g., battery 40, by flowing electric current therethrough, wherein the electrical current originates from a remote electric power source. Functions of the battery charger 14 may include modifying electric power originating from the remote electric power source by adjusting the voltage level, rectifying and otherwise filtering the incoming electric power prior to supplying it to the electrochemical cell. Modifying the incoming electric power may be accomplished employing electrical elements such as a step-up/step-down transformer, a rectifier, a switching power supply, a filter network and/or other suitable electrical charger components known in the art. Furthermore, the battery charger 14 may include a cooling unit and related elements to remove heat generated by the operation of the battery charger 14.

The battery charger 14 electrically connects via an externally accessible power coupler 12 to the remote electric power source, which is an off-vehicle AC electrical power source in one embodiment. Details of an exemplary power coupler 12, including specifications related to accessibility, connectivity and related matters are known and not described in detail herein. A voltage sensor 13 monitors the AC voltage from the off-vehicle AC electrical power source. In one embodiment the battery charger 14 may not include any form of an electrical current sensor and thus may be incapable of monitoring electrical power supplied to the high-voltage bus 30. The charger controller 15 exercises charge control over the battery charger 14, including commanding a magnitude of electrical current through the battery charger 14 employing a suitable control signal such as pulsewidth-modulated control signal. The charger controller 15 includes the capability to command zero current flow, i.e., to electrically disconnect the on-vehicle high-voltage electrical circuit 20 from the off-vehicle AC electrical power source even when they are mechanically connected through the power coupler 12. In one embodiment, the charger controller 15 communicates with the on-vehicle controller 90.

The off-vehicle AC electrical power source supplying electrical power through the power coupler 12 may be one of a number of different power supply types known in the art. For example, the off-vehicle AC electrical power source may be a public electrical utility that provides power via standard power outlets (e.g., 110 VAC or 220 VAC outlets), or it can be a portable generator such as the type that runs on natural gas, propane, gasoline, diesel, or the like. In one embodiment, the off-vehicle AC electrical power source is a renewable power source, such as a remote charging station powered by energy from solar panels, wind turbines, hydroelectric means, biomass, etc. The off-vehicle AC electrical power source is not limited to any particular type or embodiment, so long as it can provide electrical power to the P-EV 10 through the power coupler 12. In one embodiment, the AC electrical power source may supply electrical power at a voltage within a range between 85 Vac and 265 Vac.

The high-voltage bus 30 includes a positive bus 32 and a negative bus 34 that electrically connect to the battery 40 and the high-voltage on-vehicle loads 50. The battery charger 14 converts AC electrical power from the external power source to DC electric power for charging the high-voltage battery 40 and supplying electric power to the high-voltage on-vehicle loads 50 in response to charging control signals from the charger controller 15. The high-voltage bus 30 includes charging contactors, heaters, fuses, capacitors, resistors, and other related elements.

The high-voltage battery 40 provides on-vehicle storage for high-voltage DC electric power that may be used to propel the P-EV 10 and to supply the high-voltage on-vehicle loads 50 with electrical power. Depending upon the specific vehicle configuration, the high-voltage battery 40 may be the primary vehicle power source for propulsion, or may be used in conjunction with another power source for power supplementation purposes, to cite two examples. Many different battery types and arrangements may be used, including the exemplary one schematically shown herein that includes the battery 40, one or more battery sensors 42 and a battery controller 44. Battery 40 may include a collection of identical or individual battery cells connected in series, parallel, or a combination of both in order to deliver a desired voltage, amperage, capacity, power density, and/or other performance characteristics. According to one embodiment, the battery 40 includes a large number of lithium ion cells, each of which exhibits between 2 VDC-4 VDC when charged with the cells connected in a series and/or a parallel configuration. Those skilled in the art will appreciate that the method described herein is not limited to any one particular type of battery or battery arrangement, as different battery types may be employed.

The battery sensors 42 may include any combination of hardware and/or software components capable of monitoring battery-related states including battery temperature, battery voltage, and battery current, with such states employed to determine battery parameters such as battery state of charge (SOC) and battery state of health (SOH). The battery sensors 42 may be integrated within a battery unit, e.g., an intelligent or smart battery, may be external sensors located outside of the battery unit, or may be provided according to some other known arrangement. The battery sensors 42 may monitor battery voltage, current, temperature, etc. on a cell-by-cell basis, as average or collective of a block of cells or region of the battery 40, as the average or collective of the entire battery 40, or according to some other method known in the art. Output from the battery sensors 42 may be provided to the battery controller 44, which communicates with controller 90 or directly with the charger controller 15.

The charger controller 15 may execute different functions pertaining to the P-EV 10, including, by way of example, monitoring the battery charger 14, cell protection, charge control, power demand management, SOC and SOH determination, cell balancing, history logging, communications, etc. The battery controller 44 may monitor one or more conditions related to the battery 40, some of which may be employed to monitor the battery charger 14, and as such may be employed to monitor and control various aspects of the charging process.

The high-voltage on-vehicle loads 50 may include one or a plurality of high-voltage electrical loads. Such loads may include an auxiliary power module 58, which converts high-voltage electric power to low-voltage electric power for powering low-voltage on-vehicle devices such as power windows, controllers, and the like. The high-voltage on-vehicle loads 50 may include a power inverter module 56, which employs high power transistors or similar devices to convert high-voltage DC electric power to AC power to electrically power one or a plurality of electric machines, e.g., motor/generators. The high-voltage on-vehicle loads 50 may include electrically-powered cabin heaters 52 for supplying heat energy to a passenger compartment of the vehicle. The high-voltage on-vehicle loads 50 may include electrically-powered air conditioning pumps 54 for removing heat from the passenger compartment. Other devices and systems may introduce other and additional electrical loads onto the high-voltage bus 30.

The terms controller, control module, module, control, control unit, processor and similar terms refer to any one or various combinations of Application Specific Integrated Circuit(s) (ASIC), electronic circuit(s), central processing unit(s), e.g., microprocessor(s) and associated non-transitory memory component in the form of memory and storage devices (read only, programmable read only, random access, hard drive, etc.). The non-transitory memory component is capable of storing machine readable instructions in the form of one or more software or firmware programs or routines, combinational logic circuit(s), input/output circuit(s) and devices, signal conditioning and buffer circuitry and other components that can be accessed by one or more processors to provide a described functionality. Input/output circuit(s) and devices include analog/digital converters and related devices that monitor inputs from sensors, with such inputs monitored at a preset sampling frequency or in response to a triggering event. Software, firmware, programs, instructions, control routines, code, algorithms and similar terms mean any controller-executable instruction sets including calibrations and look-up tables. Each controller executes control routine(s) to provide desired functions, including monitoring inputs from sensing devices and other networked controllers and executing control and diagnostic routines to control operation of actuators. Routines may be executed at periodic intervals, for example each 100 microseconds or 3.125, 6.25, 12.5, 25 and 100 milliseconds during ongoing operation. Alternatively, routines may be executed in response to occurrence of a triggering event. Communications between controllers and communications between controllers, actuators and/or sensors may be accomplished using a direct wired link, a networked communications bus link, a wireless link or any another suitable communications link. Communications includes exchanging data signals in any suitable form, including, for example, electrical signals via a conductive medium, electromagnetic signals via air, optical signals via optical waveguides, and the like. Data signals may include signals representing inputs from sensors, signals representing actuator commands, and communications signals between controllers.

A method is described herein for monitoring performance of an on-vehicle battery charger that couples an off-vehicle electrical power source to an on-vehicle battery, e.g., the battery charger 14 coupled to the battery 40 of FIG. 1. The method includes periodically executing a first, passive charger monitoring routine 200 to evaluate performance, e.g., charging efficiency of the battery charger 14 after satisfying various test enable criteria. Upon failing to achieve a passing result from the passive charger monitoring routine 200, a second, active charger monitoring routine 300 may be executed. Execution of the active charger monitoring routine 300 includes interrupting flow of charging current through the battery charger 14 and monitoring electric power flow from the battery 40 employing voltage and current sensors that monitor the battery 40. An active charging efficiency of the battery charger 14 may be determined based upon the monitored electric power flow from the on-vehicle battery, which can be employed in evaluating charging performance and detecting a fault in the battery charger 14 based upon the active charging efficiency.

Figure 2:
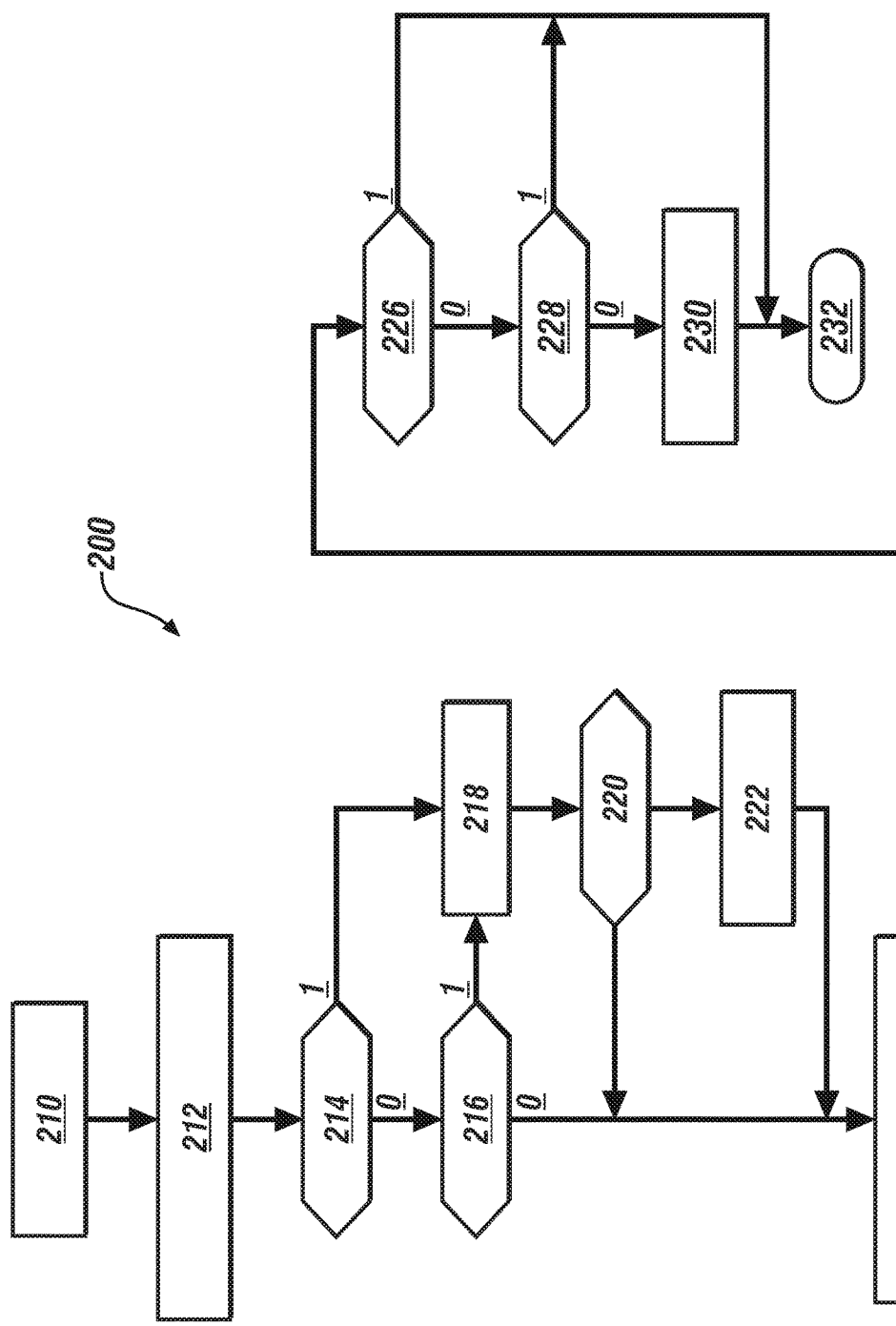
FIG. 2 schematically shows an embodiment of the passive charger monitoring routine for monitoring performance of an embodiment of the battery charger in an embodiment of the high-voltage electrical circuit described with reference to FIG. 1, in accordance with the disclosure.

FIG. 2 schematically shows an embodiment of the passive charger monitoring routine 200 for monitoring performance of an embodiment of the battery charger 14 in an embodiment of the high-voltage electrical circuit 20 described with reference to FIG. 1. Table 1 is provided as a key wherein the numerically labeled blocks and the corresponding functions are set forth as follows, corresponding to the passive charger monitoring routine 200.

TABLE 1

| BLOCK | BLOCK CONTENTS |
| --- | --- |
| 210 | Meet enable criteria |
| 212 | Estimate charging efficiency |
| 214 | Is estimated charging efficiency greater than high-voltage threshold? |
| 216 | Is estimated charging efficiency less than low-voltage threshold? |
| 218 | Increment indeterminate count |
| 220 | Is indeterminate count greater than a calibrated threshold count? |
| 222 | Indicate passive charger check is indeterminate |
| 224 | Increment passive check count |
| 226 | Is passive check count greater than a calibrated threshold count? |
| 228 | Is passive check indeterminate? |
| 230 | Indicate passive charger check pass |
| 232 | Exit iteration |

The passive charger monitoring routine 200 preferably periodically executes during a battery charging event, e.g., once every 100 ms while the battery charger 14 electrically connects via the externally accessible power coupler 12 to the remote electric power source during a period when AC power is being requested by the charger controller 15. The passive charger monitoring routine 200 is passive in that it collects data related to the operation of the battery charger 14 without executing any form of control over the related systems.

The passive charger monitoring routine 200 serves as an initial screening check of power conversion efficiency of an embodiment of the battery charger 14 when the battery charger 14 has no internal monitoring capability, i.e., has no internal capability to monitor and/or determine charging conversion efficiency, or under other conditions related to the battery charger 14. Its purpose is to identify operation of the battery charger 14 that is significantly better than a minimum acceptable level of charging efficiency. Thus, when the battery charger 14 is operating within specifications, it may be identified as acceptable at that operating point and time without further monitoring, i.e., without executing an intrusive test to evaluate the battery charger 14 during the charging process. The passive charger monitoring routine 200 provides results indicating either that the battery charger 14 has passed the passive charger check or that the result of the passive charger check is indeterminate. As described herein, the passive charger monitoring routine 200 does not generate a result indicating a fault with the battery charger 14.

In one embodiment, the passive charger monitoring routine 200 executes as follows. After enable criteria are satisfied (210), an estimated charging efficiency $e_{HVBC}$ is calculated (212) as follows:

$$e_{HVBC} = \frac{DC\ Output\ Power\ Estimate}{AC\ Input\ Power\ Estimate} = \frac{Net\ DC\ Power\ at\ Pack + Min\ HV\ Load}{AC\ Input\ Power\ Commanded} \quad [1]$$

The parameters of interest in determining the estimated charging efficiency $e_{HVBC}$ preferably include an output power of the battery charger 14, e.g., DC Output Power Estimate, and an input power to the battery charger 14, e.g., AC Input Power Estimate. In one embodiment, the DC Output Power Estimate is determined based upon a determination of net DC power at the battery 40, which may be monitored employing the battery sensors 42 (Net DC Power at Pack). A minimum, non-zero value of electrical load imposed by the high-voltage on-vehicle loads 50 is assumed. The commanded AC input power (AC Input Power Commanded) may be determined based upon the magnitude of electrical current through the battery charger 14 that is commanded by the charger controller 15 multiplied by the AC voltage, which may be an rms voltage value or another suitable measure of the AC voltage.

The estimated charging efficiency $e_{HVBC}$ that is calculated using EQ. 1 is compared with a high efficiency threshold (214) and a low efficiency threshold (216). When the estimated charging efficiency $e_{HVBC}$ is less than the high efficiency threshold (214)(0) and greater than the low efficiency threshold (216)(0), the passive charger monitoring routine 200 indicates that the battery charger 14 passes this iteration and a passive check count is incremented (224). Thus when an actual magnitude of the high-voltage on-vehicle loads 50 is greater than the assumed minimum, non-zero value of the electrical load, the estimated charging efficiency $e_{HVBC}$ that is calculated with EQ. 1 will be lower than the actual charging efficiency. However, if the actual high-voltage on-vehicle loads 50 are relatively large or if the actual charger performance has deteriorated, the resultant charging efficiency $e_{HVBC}$ that is calculated with EQ. 1 will be reduced.

Referring again to FIG. 2, when the estimated charging efficiency $e_{HVBC}$ is greater than the high efficiency threshold (214)(1) or less than the low efficiency threshold (216)(1), an indeterminate result is indicated, and an indeterminate count is incremented (218) and compared to a threshold indeterminate count (220). When the indeterminate count is greater than or equal to the threshold indeterminate count (220)(1), the passive charger monitoring routine 200 renders the passive check to be indeterminate (222) and the passive check count is incremented (224). Otherwise (220)(0), the passive check count is incremented without rendering a result for the passive check (224).

The passive check count is compared to a calibrated threshold count (226) and, if less than the threshold count (226)(0), this iteration ends (232).

When the passive check count equals the threshold count (226)(1), the passive charger monitoring routine 200 determines whether the passive check has been rendered to be indeterminate (228). When the passive check has been rendered indeterminate (228)(1), this result is captured and this iteration ends (232). When the passive check has not been rendered indeterminate (228)(0), the routine indicates that the passive check has passed (230). This result is captured and this iteration ends (232).

The passive charger monitoring routine 200 operates to determine whether the battery charger 14 described with reference to FIG. 1 is functioning as intended without executing an intrusive monitoring routine such as the active charger monitoring routine 300. Preferably the passive charger monitoring routine 200 executes between periodic executions of the active charger monitoring routine 300, if any, and disables such execution if performance of the battery charger 14 recovers.

Figure 3:
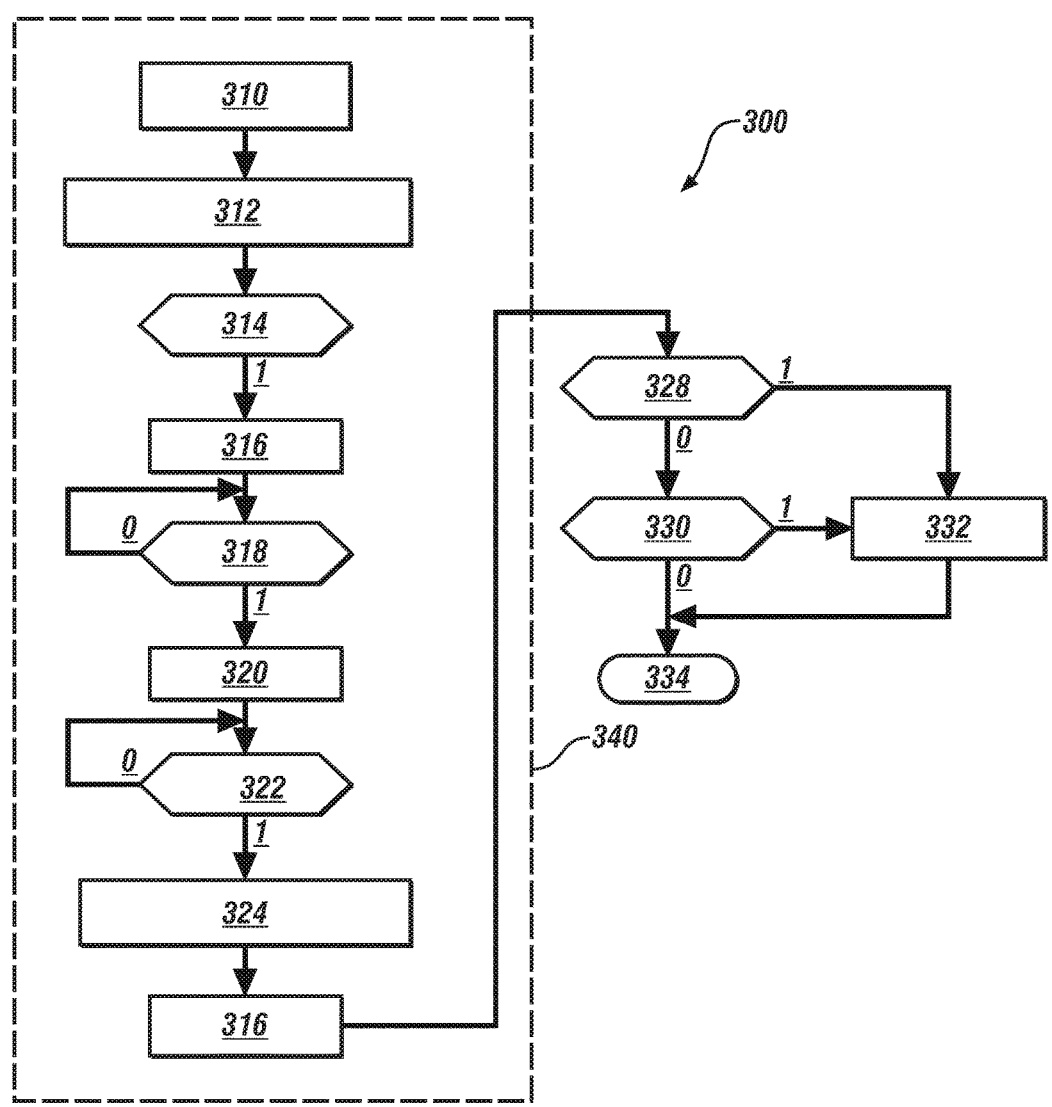
FIG. 3 schematically shows an embodiment of the active charger monitoring routine for monitoring performance of an embodiment of the battery charger in an embodiment of the high-voltage electrical circuit described with reference to FIG. 1, in accordance with the disclosure.

The active charger monitoring routine 300 executes upon achieving an indeterminate result from the passive charger monitoring routine 200 related to the estimated charging efficiency $e_{HVBC}$. FIG. 3 schematically shows an embodiment of the active charger monitoring routine 300 for monitoring performance of an embodiment of the battery charger 14 in an embodiment of the high-voltage electrical circuit 20 described with reference to FIG. 1. The active charger monitoring routine 300 includes briefly cycling the battery charger 14 off and measuring electric power flow from the battery 40 during the off period. A difference between the measured electric power flow to the battery 40 before turning the battery charger 14 off and the measured electric power flow from the battery 40 while the battery charger 14 is off provides a measure of the magnitude of DC electric power delivered to the high-voltage electrical circuit 20 from the battery charger 14. This result may be employed to estimate charger efficiency of the battery charger 14, as described herein. Table 3 is provided as a key wherein the numerically labeled blocks and the corresponding functions are set forth as follows, corresponding to the active charger monitoring routine 300.

TABLE 3

| BLOCK | BLOCK CONTENTS |
|---|---|
| 310 | Meet enable criteria |
| 312 | Collect data related to commanded AC input power and DC power at battery |
| 314 | Sufficient quantity of data collected? |
| 316 | Request shutdown of battery charger |
| 318 | Battery charger shutdown achieved? |
| 320 | Collect data related to DC power at battery |
| 322 | Sufficient quantity of data collected? |
| 324 | Calculate active charging efficiency |
| 326 | Re-enable battery charger |
| 328 | Is active charging efficiency greater than high threshold? |
| 330 | Is active charging efficiency less than low threshold? |
| 332 | Indicate battery charger fault |
| 334 | End |

The active charger monitoring routine 300 executes only when the passive charger monitoring routine 200 indicates that the result of the passive check is indeterminate, or when the passive charger monitoring routine 200 has not executed for a period of time. After enable criteria are satisfied (310), data is collected related to the commanded AC input power and the DC power at the battery 40 during operation of the battery charger 14 to charge the battery 40 (312). One monitored parameter includes a determination of DC power at the battery 40 based upon current and voltage levels, preferably determined as an average value over a period of time, referred to in EQ. 2 as P[DC Power before shutdown]. Another monitored parameter includes a commanded AC input power to the battery charger 14 based upon current and voltage levels, referred to in EQ. 2 as P[Commanded AC Input Power], which is preferably determined as an average value over a period of time. When a sufficient quantity of data has been collected (314)(1), deactivation and shutdown of the battery charger 14 is requested (316), and electric power is monitored for a period of time to verify that such shutdown has been achieved (318)(0), (318)(1).

When shutdown of the battery charger 14 is achieved (318)(1), signal outputs of the battery sensors 42 are monitored for a period of time to determine a net DC power flow at the battery 40 after charger shutdown, referred to in EQ. 2 as P[DC Power after shutdown] (320). The net DC power flow at the battery 40 after charger shutdown provides a measurement of the electrical power passing out of the battery 40 to service the on-vehicle high-voltage loads 50, and thus indicates the magnitude of electrical power that is not being used to charge the battery 40 and instead is being consumed by the on-vehicle high-voltage loads 50 during charging. When a sufficient amount of data has been collected (322)(1), an active charging efficiency E is calculated (324) as follows:

$$E = \frac{P[\text{DC Power before shutdown}] - P[\text{DC Power after showdown}]}{P[\text{Commanded AC Input Power}]} \quad [2]$$

The DC power at the battery 40 prior to shutdown (P[DC Power before shutdown]) represents the net electrical power received by the battery 40 from the battery charger 14, i.e., the power to the battery 40 after parasitic loads are accounted for. The DC power flow at the battery 40 after charger shutdown (P[DC Power after shutdown]) represents that portion thereof that is not being used to charge the battery 40. Thus, the output high-voltage DC power flow from the battery charger 14 may be determined based upon a difference thereof, as indicated with reference to EQ. 2. The active charging efficiency E is determined as a fraction or percentage relation of this difference with the commanded AC input power to the battery charger 14 (P[Commanded AC Input Power]).

After the active charging efficiency E is determined, the battery charger 14 is re-enabled to continue charging the battery 40 (326). The active charging efficiency E is compared with a high efficiency threshold (328) and a low efficiency threshold (330). When the active charging efficiency E is greater than the high efficiency threshold (328)(1) or less than the low efficiency threshold (330)(1), a battery charger fault is indicated (332). Otherwise, when the active charging efficiency E is between the high efficiency threshold (328)(0) and the low efficiency threshold (330)(0), this iteration of the active charger monitoring routine 300 ends, indicating that the battery charger 14 has passed this iteration (334).

Element 340, indicated by steps 310 through 326 may be commanded to execute by action of a technician employing hand-held scan tool as part of a service bay diagnostic routine.

The passive charger monitoring routine 200 and the active charger monitoring routine 300 employ enable criteria that may include a compounded enablement strategy, including common enable criteria, enable criteria that are specific to the passive charger monitoring routine 200, and enable criteria that are specific to the active charger monitoring routine 300. The common enable criteria include determining that the system voltage is in range, the battery charger 14 has been provided with 12V power to enable its operation, the vehicle is in a key-off state, there are no faults associated with the battery sensors 42, the battery charger 14 is plugged into an AC voltage source, the charger controller 15 is enabled and the system is ready to convert AC power to DC power. Other common enable criteria include, on systems so equipped, determining that cooling systems and temperatures associated with power electronic devices are functional and within an allowable temperature range. The enable criteria for the passive charger monitoring routine 200 include meeting the common enable criteria, having the AC commanded input power greater than a minimum threshold power for longer than a minimum period of time, and determining there is no active request to execute a battery charger shutdown. The enable criteria for the active charger monitoring routine 300 include meeting the common enable criteria, having the AC commanded input power greater than a minimum threshold power for longer than a minimum period of time, and determining the passive charger monitoring routine 200 has yielded an indeterminate result or has not yielded a passing result after a period of time. The enable criteria for the active charger monitoring routine 300 may also include a command from a hand-held scan tool to execute the active charger monitoring routine 300.

Fault maturation can include employing an X of Y strategy to mature a diagnostic, wherein the X of Y strategy includes identifying a quantity of X faults during Y observations, or executions of either the passive charger monitoring routine 200 or the active charger monitoring routine 300, and making an adverse decision only when the value of X is greater than a threshold. By way of example, a fault may mature only when there are X=3 faults during Y=10 observations. Assigning values to X and Y is application-specific, with such processes known to those skilled in the art.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims.

The invention claimed is:

1. A method for monitoring an on-vehicle battery charger electrically coupling an off-vehicle electrical power source to an on-vehicle battery, the method comprising:
   estimating a charging efficiency of the battery charger during battery charging; and
   upon achieving an indeterminate result related to the estimated charging efficiency of the battery charger:
      determining a commanded input power to the battery charger and determining an electric power at the on-vehicle battery during operation of the battery charger, and then,
      interrupting flow of electric current through the battery charger,
      monitoring electric power flow from the on-vehicle battery when the flow of electric current through the battery charger is interrupted,
      determining an active charging efficiency of the battery charger based upon the commanded input power to the battery charger, the electric power at the on-vehicle battery during operation of the battery charger and the monitored electric power flow from the on-vehicle battery when the flow of electric current through the battery charger is interrupted, and
      evaluating charging performance of the battery charger based upon the active charging efficiency.

2. The method of claim 1, wherein estimating a charging efficiency of the battery charger further comprises:
   estimating an output power from the battery charger and estimating an input power to the battery charger, and
   estimating the charging efficiency of the battery charger based upon the estimated output power from the battery charger and the estimated input power to the battery charger.

3. The method of claim 2, wherein estimating the input power to the battery charger comprises determining a magnitude of electric current commanded through the battery charger.

4. The method of claim 2, wherein estimating the output power from the battery charger comprises determining a net DC power at the battery and estimating a minimum electrical power flow to on-vehicle loads.

5. The method of claim 1, wherein estimating the charging efficiency of the battery charger during battery charging further comprises passively estimating the charging efficiency of the battery charger during battery charging.

6. The method of claim 1, wherein estimating the charging efficiency of the battery charger further comprises periodically estimating the charging efficiency of the battery charger.

7. The method of claim 1, wherein evaluating the charging performance of the battery charger based upon the active charging efficiency further comprises detecting a fault in the battery charger when the active charging efficiency is less than a low efficiency threshold.

8. The method of claim 1, wherein evaluating the charging performance of the battery charger based upon the active charging efficiency further comprises detecting a fault in the battery charger when the active charging efficiency is greater than a high efficiency threshold.

9. The method of claim 1, wherein monitoring electric power flow from the on-vehicle battery when the flow of electric current through the battery charger is interrupted further comprises monitoring electric power flow from the on-vehicle battery to on-vehicle loads when the flow of electric current through the battery charger is interrupted.

10. A method for monitoring an on-vehicle battery charger electrically coupling an off-vehicle electrical power source to an on-vehicle battery, the method comprising:
   determining a commanded input power to the battery charger and determining an electric power at the on-vehicle battery during operation of the battery charger; and then,
   interrupting flow of electric current through the battery charger;
   monitoring electric power flow from the on-vehicle battery when the flow of electric current through the battery charger is interrupted;
   determining an active charging efficiency of the battery charger based upon the commanded input power to the battery charger, the electric power at the on-vehicle battery during operation of the battery charger and the monitored electric power flow from the on-vehicle battery when the flow of electric current through the battery charger is interrupted; and
   evaluating charging performance of the battery charger based upon the active charging efficiency.

11. The method of claim 10, further comprising executing the method for monitoring the on-vehicle battery charger in response to an execution command originating from a hand-held scan tool.

12. The method of claim 10, wherein evaluating the charging performance of the battery charger based upon the active charging efficiency further comprises detecting a fault in the battery charger when the active charging efficiency is less than a low efficiency threshold.

13. The method of claim 10, wherein evaluating the charging performance of the battery charger based upon the active charging efficiency further comprises detecting a fault in the battery charger when the active charging efficiency is greater than a high efficiency threshold.

14. A high voltage electric circuit for a vehicle, comprising:
   an on-vehicle battery charger couplable to an off-vehicle electrical power source;
   a high-voltage bus electrically connected to an on-vehicle battery;
   a plurality of on-vehicle loads electrically connected to the high-voltage bus; and
   a controller including a control routine, said control routine executable to:
      passively estimate a charging efficiency of the battery charger, and
      upon achieving an indeterminate result related to the estimated charging efficiency of the battery charger,
         determine a commanded input power to the battery charger and determining an electric power at the on-vehicle battery during operation of the battery charger, and then,
         interrupt flow of electric current through the battery charger,
         monitor electric power flow from the on-vehicle battery when the flow of electric current through the battery charger is interrupted,
         determine an active charging efficiency of the battery charger based upon the commanded input power to the battery charger, the electric power at the on-vehicle battery during operation of the battery charger and the monitored electric power flow from the on-vehicle battery when the flow of electric current through the battery charger is interrupted, and
         evaluate charging performance of the battery charger based upon the active charging efficiency.

* * * * *